US012777880B2

(12) United States Patent
He et al.

(10) Patent No.: US 12,777,880 B2
(45) Date of Patent: Oct. 27, 2026

(54) PREPARATION METHOD OF FAN-IN PACKAGE STRUCTURE, AND FAN-IN PACKAGE STRUCTURE

(71) Applicant: Forehope Electronic (Ningbo) Co., Ltd., Ningbo City (CN)

(72) Inventors: Zhenghong He, Ningbo City (CN); Chao Zhang, Ningbo City (CN)

(73) Assignee: FOREHOPE ELECTRONIC (NINGBO) CO., LTD., Ningbo City (CN)

( * ) Notice: Subject to any disclaimer, the term of this patent is extended or adjusted under 35 U.S.C. 154(b) by 693 days.

(21) Appl. No.: 18/196,246

(22) Filed: May 11, 2023

(65) Prior Publication Data

US 2024/0063036 A1 Feb. 22, 2024

(30) Foreign Application Priority Data

Aug. 17, 2022 (CN) ........................ 202210983781.5

(51) Int. Cl.
*H10P 72/00* (2026.01)
*C25D 5/02* (2006.01)
(Continued)

(52) U.S. Cl.
CPC .......... *H10P 72/0476* (2026.01); *C25D 5/022* (2013.01); *H10W 70/093* (2026.01); (Continued)

(58) Field of Classification Search
None
See application file for complete search history.

(56) References Cited

U.S. PATENT DOCUMENTS 6,884,717 B1 4/2005 Desalvo et al.
2007/0167004 A1 7/2007 Trezza
(Continued)

FOREIGN PATENT DOCUMENTS

CN 103681573 A 3/2014
CN 104218028 A 12/2014
(Continued)

OTHER PUBLICATIONS

Notification to Grant Patent Right for Invention issued in related Chinese Application No. 2022109837815, by the State Intellectual Property Office of People's Republic of China, in 3 pages.
(Continued)

*Primary Examiner* — Louis J Rufo
(74) *Attorney, Agent, or Firm* — Davis Wright Tremaine LLP

(57) ABSTRACT

The present disclosure provides a preparation method of a fan-in package structure and a fan-in package structure, relating to the technical field of semiconductor packaging. In this method, holes are provided in an edge region of a wafer, a conductive metal is deposited to form metal posts, then after a protective layer and a first dielectric layer are sequentially prepared, a circuit layer is formed by electroplating, and then a second dielectric layer and a conductive bump are formed, wherein the metal posts penetrate through a front surface and a back surface of the wafer, so that the front surface and the back surface of the wafer realize equipotential.

19 Claims, 9 Drawing Sheets

(51) Int. Cl.

| | |
|---|---|
| ***C25D 7/12*** | (2006.01) |
| ***H10W 70/05*** | (2026.01) |
| ***H10W 70/65*** | (2026.01) |
| ***H10W 74/01*** | (2026.01) |
| ***H10W 90/00*** | (2026.01) |

(52) U.S. Cl.

CPC ......... *H10W 70/65* (2026.01); *H10W 74/014* (2026.01); *H10W 90/701* (2026.01); *C25D 7/123* (2013.01)

(56) References Cited

U.S. PATENT DOCUMENTS

| | | | | |
|---|---|---|---|---|
| 2012/0086122 | A1 | 4/2012 | Cheng et al. | |
| 2015/0311140 | A1 | 10/2015 | Kalnitsky et al. | |
| 2017/0025342 | A1* | 1/2017 | Tseng | H10W 70/095 |
| 2018/0076166 | A1* | 3/2018 | Yu | H10W 72/20 |

FOREIGN PATENT DOCUMENTS

| | | | |
|---|---|---|---|
| CN | 208904014 | U | 5/2019 |
| CN | 110010561 | A | 7/2019 |
| CN | 110045531 | A | 7/2019 |
| CN | 110504282 | A | 11/2019 |
| CN | 110767622 | A | 2/2020 |
| CN | 113517249 | A | 10/2021 |
| JP | 2007294746 | A | 11/2007 |
| JP | 2012142335 | A | 7/2012 |

OTHER PUBLICATIONS

First Office Action issued in related Chinese Application No. 2022109837815, by the State Intellectual Property Office of People's Republic of China, in 7 pages.

First Search issued in related Chinese Application No. 2022109837815, in 2 pages.

Supplementary Search issued in related Chinese Application No. 2022109837815, in 2 pages.

* cited by examiner

PREPARATION METHOD OF FAN-IN PACKAGE STRUCTURE, AND FAN-IN PACKAGE STRUCTURE

CROSS-REFERENCE TO RELATED APPLICATION

The present disclosure claims the priority to a Chinese patent application with the filing No. 202210983781.5, filed with the Chinese Patent Office on Aug. 17, 2022, and entitled "PREPARATION METHOD OF FAN-IN PACKAGE STRUCTURE AND FAN-IN PACKAGE STRUCTURE," the contents of which are incorporated herein in entirety by reference.

TECHNICAL FIELD

The present disclosure relates to the technical field of semiconductor packaging, and in particular, the present disclosure relates to a preparation method of a fan-in package structure and a fan-in package structure.

BACKGROUND ART

With the rapid development of the semiconductor industry, wafer-level packaging is divided into fan-out and fan-in. Sputter-deposition refers to a method in which high-energy particles are used to bombard a target material, to make atoms in the target material to be sputtered out and deposited on a surface of a substrate to form a thin film. During the sputter-deposition, wafer is fixed in a reaction chamber of a wafer sputtering device, electrostatic ions easily exist on a wafer surface during the sputtering process, the bombardment process may easily cause the wafer to be broken down by electric ions up and down, so that hidden crack points appear on a back surface of the wafer, and abnormal electric discharge phenomena such as arcing are formed on the surface. In addition, various materials are used in the wafer manufacturing process, and mismatch of coefficients of thermal expansion of the materials tends to cause non-uniform stress release of the wafer, further causing phenomena such as non-uniformity of wiring layer and electroplated metal.

SUMMARY

Objectives of the present disclosure include, for example, providing a preparation method of a fan-in package structure and a fan-in package structure, which can effectively solve the problem of electrostatic discharge in a wafer processing process, so as to avoid the problem that upper and lower sides of the wafer are broken down by electric ions due to electrostatic ion bombardment in a sputtering process, meanwhile avoid appearance of hidden crack points on the back surface of the wafer and the abnormal electric discharge phenomenon on the surface of the wafer, so as to ensure normal operation of the wafer, improve edge strength of the wafer, improve heat dissipation performance of the wafer, ensure the electroplating uniformity, and improve the electroplating efficiency.

Embodiments of the present disclosure can be realized as follows.

In a first aspect, the present disclosure provides a preparation method of a fan-in package structure, including:

completing a chip manufacturing process in an active area of a wafer, so as to form the wafer with a pad on a front surface;

providing holes in an edge region of the wafer and depositing a metal so as to form metal posts;

forming a protective layer not covering the metal posts on the front surface of the wafer;

forming a first dielectric layer not covering the metal posts on the protective layer;

forming a circuit layer covering the metal posts on the first dielectric layer by electroplating;

removing the circuit layer covering the metal posts by etching, to expose the metal posts;

forming a second dielectric layer on the circuit layer; and forming a conductive bump on the second dielectric layer, wherein the metal posts penetrate through the front surface and the back surface of the wafer, so that the front surface and the back surface of the wafer realize equipotential.

In a second aspect, the present disclosure provides a fan-in package structure, prepared by the preparation method of a fan-in package structure according to the preceding embodiment, wherein the fan-in package structure includes:

a device base with a pad on a front surface thereof;

a protective layer provided on the front surface of the device base;

a first dielectric layer provided on the protective layer, wherein the first dielectric layer is provided with a protective opening penetrating to the pad;

a circuit layer provided on the first dielectric layer, wherein the circuit layer is in electrical contact with the pad;

a second dielectric layer provided on the circuit layer; and a conductive protrusion provided on the second dielectric layer, wherein the conductive protrusion is in electrical contact with the circuit layer.

BRIEF DESCRIPTION OF DRAWINGS

In order to more clearly illustrate the technical solutions of embodiments of the present disclosure, drawings which need to be used in the embodiments will be introduced briefly below. It should be understood that the drawings below merely show some embodiments of the present disclosure, and therefore should not be considered as limitation to the scope. Those ordinarily skilled in the art still could obtain other relevant drawings according to these drawings, without using any creative efforts.

REFERENCE SIGNS

Figure 1:
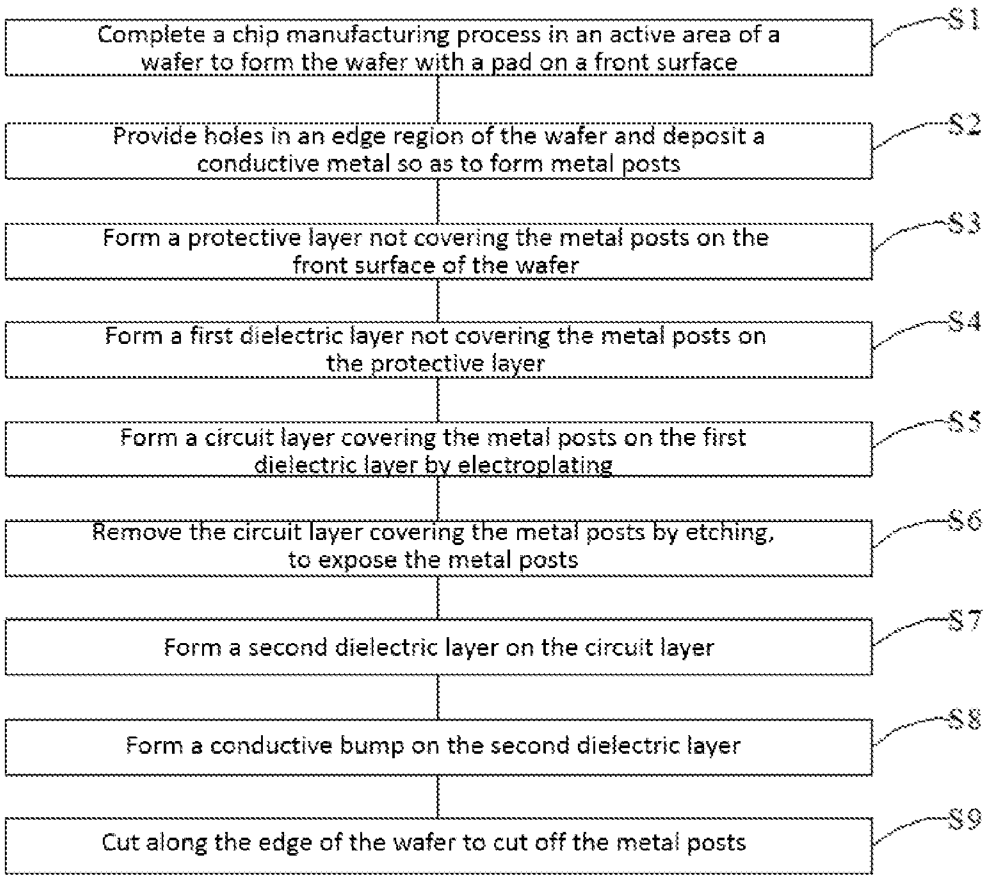
FIG. 1 is a block diagram of steps of a preparation method of a fan-in package structure provided in a first embodiment of the present disclosure.

100—fan-in package structure; 110—device base; 111—pad; 130—protective layer; 150—first dielectric layer;

170—circuit layer; 171—metal layer; 180—second dielectric layer; 190—conductive protrusion; 200—wafer; 210—silicon substrate; 211—metal layer; 230—oxide layer; 250—source; 270—drain; 290—gate structure; 300—metal post; 400—back glue film layer; 500—protective glue layer; 600—adhesive layer.

DETAILED DESCRIPTION OF EMBODIMENTS

Technical solutions in the embodiments of the present disclosure will be described below clearly and completely in combination with drawings in the embodiments of the present disclosure, and apparently, only some but not all embodiments are described. Generally, components in the embodiments of the present disclosure described and shown in the drawings herein may be arranged and designed in different configurations. Therefore, the detailed description below of the embodiments of the present disclosure provided in the drawings is not intended to limit the scope of protection of the present disclosure, but merely represents chosen embodiments of the present disclosure. Based on the embodiments of the present disclosure, all of other embodiments obtained by a person skilled in the art without using any creative efforts shall fall within the scope of protection of the present disclosure.

If no specific conditions are specified in the embodiments, they are carried out under normal conditions or conditions recommended by manufacturers. If manufacturers of reagents or apparatuses used are not specified, they are conventional products commercially available.

In the present disclosure, orientation or positional relationships indicated by terms such as “upper”, “lower”, “left”, “right”, “front”, “rear”, “top”, “bottom”, “inner”, “outer”, “middle”, “vertical”, “horizontal”, “transverse”, and “longitudinal” are based on orientation or positional relationships as shown in the drawings. These terms are mainly used to better describe the present disclosure and embodiments thereof, and are not used to limit that the indicated device, element, or component must be in a specific orientation, or be constructed and operated in a specific orientation.

Moreover, some of the above terms may be used to indicate other meanings in addition to the orientation or positional relationships, for example, the term “upper” may also be used to indicate a certain attachment relationship or connection relationship in some cases. For those ordinarily skilled in the art, specific meanings of these terms in the present disclosure could be understood according to specific circumstances.

Besides, terms “install”, “set”, “provide”, “connect”, and “join” should be understood in a broad sense. For example, it may be a fixed connection, a detachable connection, or an integral connection; it may be a mechanical connection, and also may be an electrical connection; it may be a direct connection, indirect connection through an intermediary, or inner communication between two devices, elements or components. For those ordinarily skilled in the art, the specific meanings of the above terms in the present disclosure can be understood according to specific situations.

Besides, terms such as “first” and “second” are mainly used to distinguish different devices, elements or components (specific types and structures may be the same or different), rather than indicating or implying the relative importance or quantity of the indicated device, element or component. “Multiple (a plurality of)” means two or more, unless otherwise illustrated.

The embodiments of the present disclosure can be realized as follows.

In a first aspect, the present disclosure provides a preparation method of a fan-in package structure, including:

completing a chip manufacturing process in an active area of a wafer, so as to form the wafer with a pad on a front surface;

providing holes in an edge region of the wafer and depositing a metal so as to form metal posts;

forming a protective layer not covering the metal posts on the front surface of the wafer;

forming a first dielectric layer not covering the metal posts on the protective layer;

forming a circuit layer covering the metal posts on the first dielectric layer by electroplating;

removing the circuit layer covering the metal posts by etching, to expose the metal posts;

forming a second dielectric layer on the circuit layer; and forming a conductive bump on the second dielectric layer, wherein the metal posts penetrate through the front surface and the back surface of the wafer, so that the front surface and the back surface of the wafer realize equipotential.

In some embodiments, the step of forming a circuit layer covering the metal posts on the first dielectric layer by electroplating includes:

forming a protective glue layer on the first dielectric layer;

forming a circuit pattern slot on the protective glue layer;

forming the circuit layer in the circuit pattern slot with the metal post as a start point of electroplating, and removing the protective glue layer.

In some embodiments, before the step of forming the circuit layer in the circuit pattern slot by electroplating with the metal post as a start point of electroplating, the preparation method further includes:

placing the wafer on an electroplating platform upside down.

In some embodiments, before the step of forming the circuit layer in the circuit pattern slot by electroplating with the metal post as a start point of electroplating, the preparation method further includes:

immersing the wafer in an electroplating solvent.

In some embodiments, before the step of forming the circuit layer in the circuit pattern slot with the metal post as a start point of electroplating, the preparation method further includes:

coating an adhesive layer on the back surface of the wafer; and sticking the back surfaces of two wafers together through the adhesive layer, wherein two metal posts are corresponding to each other.

In some embodiments, before the step of sticking the back surfaces of two wafers together through the adhesive layer, the preparation method further includes:

providing a groove on the adhesive layer, and exposing the metal posts; and filling a conductive glue layer in the groove, wherein the conductive glue layer is configured to be in contact with adjacent metal post.

In some embodiments, before the step of forming the circuit layer in the circuit pattern slot with the metal post as a start point of electroplating, the preparation method further includes:

sticking the protective glue layers on the two wafers correspondingly together, wherein two metal posts are arranged in a staggered manner.

In some embodiments, after the step of forming a conductive bump on the second dielectric layer, the preparation method further includes:

cutting along an edge of the wafer to cut off the metal posts.

In some embodiments, the step of completing a chip manufacturing process in an active area of a wafer includes:

providing a silicon substrate;

forming a hole on a back surface of the silicon substrate by etching;

electroplating in the hole to form a metal layer;

forming at least two discrete fins on a front surface of the silicon substrate;

forming a gate structure across the fins; and forming a source and a drain on two sides of the gate structure; wherein the metal layer is provided correspondingly to the fins.

In some embodiments, after the step of forming a conductive bump on the second dielectric layer, the preparation method further includes:

forming a back glue film layer on the back surface of the wafer.

In a second aspect, the present disclosure provides a fan-in package structure, prepared by the preparation method of a fan-in package structure according to any one of the preceding embodiments, wherein the fan-in package structure includes:

a device base with a pad on a front surface thereof;

a protective layer provided on the front surface of the device base;

a first dielectric layer provided on the protective layer, wherein the first dielectric layer is provided with a protective opening penetrating to the pad;

a circuit layer provided on the first dielectric layer, wherein the circuit layer is in electrical contact with the pad;

a second dielectric layer provided on the circuit layer; and a conductive protrusion provided on the second dielectric layer, wherein the conductive protrusion is in electrical contact with the circuit layer.

As disclosed in the Background Art, in the prior art, during the wafer sputtering processing, as electrostatic ions easily exist on a wafer surface during the sputtering process, the bombardment process may easily cause the wafer to be broken down up and down by electric ions, so that hidden crack points appear on a back surface of the wafer, and abnormal electric discharge phenomena such as arcing are formed on the surface, further affecting normal operation of the wafer, and reducing the yield. In addition, various materials are used in the wafer manufacturing process, and mismatch of coefficients of thermal expansion of the materials tends to cause non-uniform stress release of the wafer, further causing phenomena such as non-uniformity of wiring layer and electroplated metal, and further reducing the yield.

Conventional FinFET, referred to as fin field-effect transistor (FinFET), is a new complementary metal-oxide-semiconductor (CMOS) transistor, and the conventional FinFET structure includes: an oxide layer formed above a substrate; a source structure, a channel region, and a drain structure. FinFET is generally more likely to be affected by electrostatic discharge (ESD). FinFET has a relatively high current, and because of a general capability of the FinFET for preventing a short channel effect, FinFET has an advantage in technologies for smaller dimensions. Since an effective width of the channel is increased as a gate surrounds the channel, FinFET typically has an increased drive current, which necessarily brings problems such as increased heat and increased risk of being affected by static electricity.

In order to solve the above problems, the present disclosure provides a novel preparation method of a fan-in package structure and a fan-in package structure. It should be noted that features in the embodiments of the present disclosure may be combined with each other without conflict.

An embodiment of the present disclosure provides a preparation method of a fan-in package structure, for preparing a fan-in package structure 100, which can effectively solve the problem of electrostatic discharge in the wafer processing process, so as to avoid the problem that upper and lower sides of the wafer are broken down by electric ions due to electrostatic ion bombardment in a sputtering process, meanwhile avoid appearance of hidden crack points on a back surface of the wafer and abnormal electric discharge phenomenon on the surface of the wafer, ensure normal operation of the wafer, improve edge strength of the wafer, improve heat dissipation performance thereof, ensure electroplating uniformity, and improve electroplating efficiency.

Referring to FIG. 1, the preparation method of a fan-in package structure provided in the present embodiment includes the following steps.

S1: completing a chip manufacturing process in an active area of a wafer 200, so as to form the wafer 200 with a pad 111 on a front surface.

Figure 2:
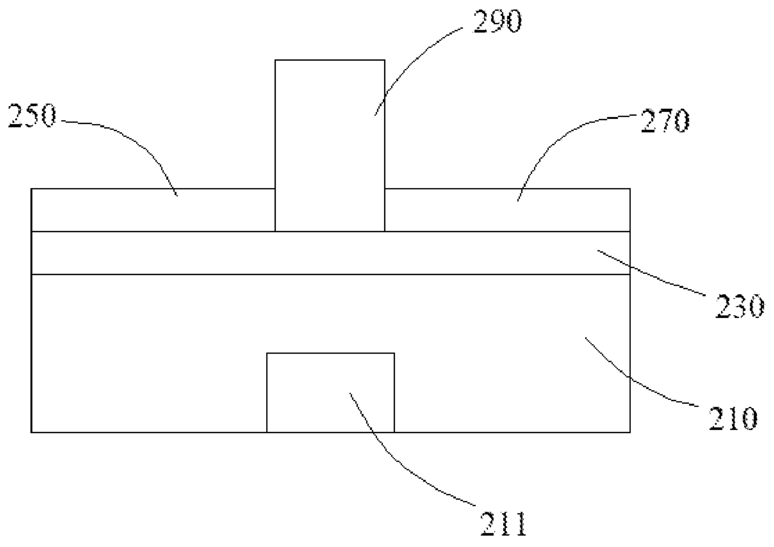
FIG. 2 is a schematic diagram of a FinFET structure prepared and formed on a wafer.
Figure 3:
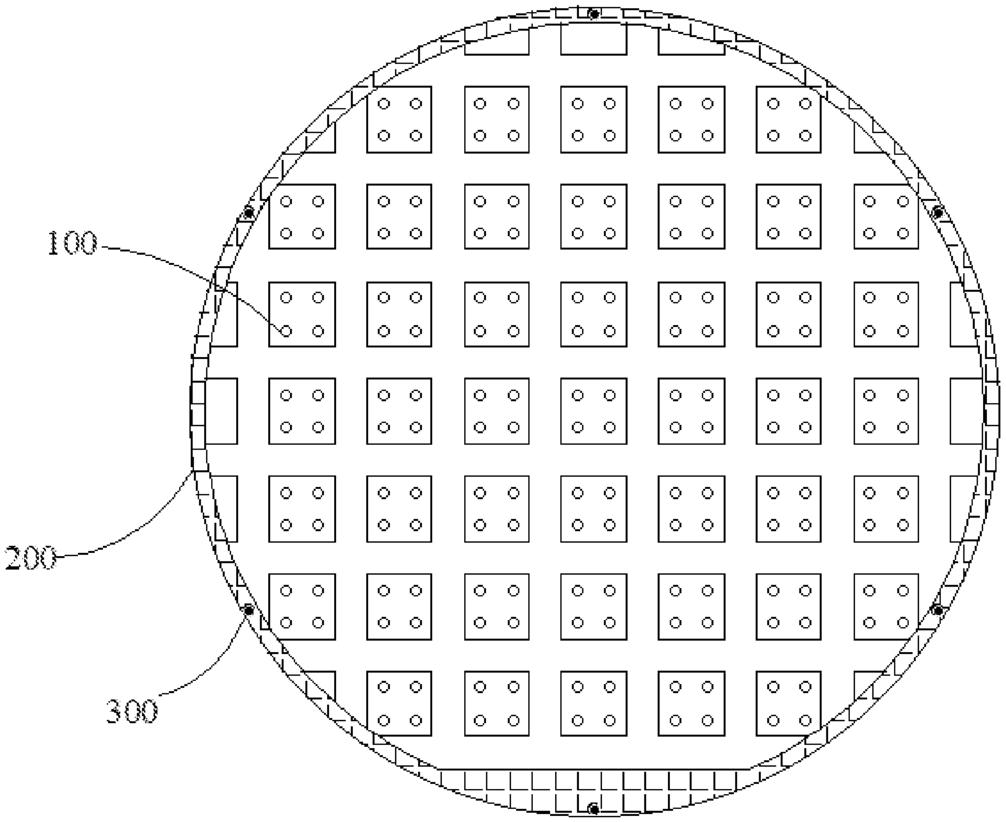
FIG. 3 is a structural schematic diagram with metal posts formed at an edge of the wafer.
Figure 4:
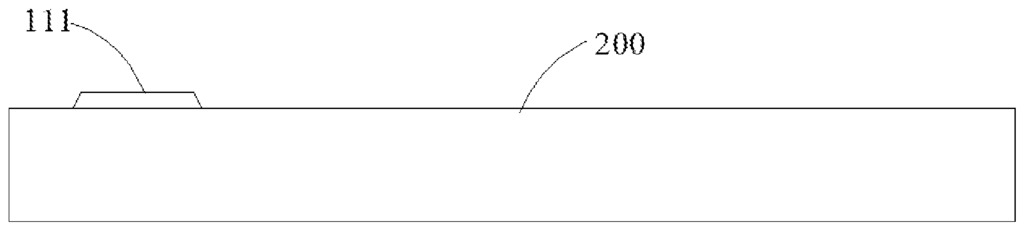
FIG. 4 to FIG. 13 are process flowcharts of the preparation method of a fan-in package structure provided in an embodiment of the present disclosure.

Specifically, referring to FIG. 2 to FIG. 4, firstly, the wafer 200 is provided, and the chip manufacturing process is completed in the active area of the wafer 200, wherein the active area is located in a middle area of the wafer 200, and the chip manufacturing process herein may be a manufacturing process of a conventional planar chip or a manufacturing process of a fin chip.

In the present embodiment, completing the chip manufacturing process in the active area of the wafer 200 may be completing a manufacturing process of a fin field-effect transistor (FinFET). Specifically, first, a silicon substrate 210, i.e., a silicon-material wafer 200, is provided, then a hole is formed on a back surface of the silicon substrate 210 by etching, electroplating is performed in the hole to form a metal layer 211, then at least two discrete fins are formed on the front surface of the silicon substrate 210, after that, a gate structure 290 across the fins is formed, and then a source 250 and a drain 270 are formed on two sides of the gate structure 290, wherein the metal layer 211 is provided correspondingly to the fins.

The FinFET structure provided in the present embodiment includes: an oxide layer 230 formed above a silicon substrate 210; a source 250 structure, a channel region, and a drain 270 structure. FinFET is generally more likely to be affected by electrostatic discharge (ESD). FinFET has a relatively high current, and because the FinFET is capable of preventing a short channel effect, FinFET has an advantage in technologies for smaller dimensions. Since an effective width of the channel is increased as a gate surrounds the channel, FinFET typically has an increased drive current, which necessarily brings increased heat and increased risk of being affected by static electricity. In the present embodiment, by providing the metal layer 211 on the back surface of the silicon substrate 210, the electrostatic problem is effectively solved, and the heat dissipation capability is improved.

In the present embodiment, when actually preparing the FinFET structure, first, the silicon substrate 210 is processed, then the hole is formed by etching on the back surface of the silicon substrate 210 (a material such as germanium and other elemental semiconductor materials, such as silicon, gallium arsenide, indium arsenide or indium phosphide, etc.), then electroplating is performed in the hole to form the metal layer 211, which metal layer 211 can effectively solve the problem of electrostatic discharge in the manufacturing process of the FinFET structure, then the oxide layer 230 is formed on the substrate surface, then a semiconductor layer (silicon (Si), carbon (C), germanium (Ge), silicon germanium (SiG, etc.)) is formed on the oxide layer 230, wherein the oxide layer 230 and the semiconductor layer/gate layer can be formed through a chemical vapor deposition (CVD) process, a physical vapor deposition (PVD) process, and an atomic layer deposition (ALD) process. In the above, the gate structure 290 is made of a gate dielectric layer, for example, high-k dielectric materials such as silicon oxide ($SiO_x$), silicon nitride ($Si_xN_y$), silicon oxynitride (SiON), then left and right parts of the gate layer are removed, and a dopant is doped in the semiconductor layer, wherein the dopant may be an N-type dopant of arsenic (As), phosphorus (P) or stibonium (SB) or the like or a P-type dopant of boron (B) or boron fluorine ($BF_2$) or the like. The semiconductor layer is patterned to form the fin structure between two block structures, wherein one part thereof is the source 250 structure, and the other part thereof is the drain 270 structure. It should be noted that, after the metal layer 211 is formed on the back surface of the silicon substrate 210, a basic manufacturing process of forming the FinFET structure on the front surface of the silicon substrate 210 is consistent with the conventional manufacturing process of the FinFET structure, which is not specifically limited herein.

In the present embodiment, by forming the metal layer 211 on the back surface of the silicon substrate 210 correspondingly to the fins, the heat dissipation performance and structural strength of the FinFET structure can be effectively improved, and meanwhile the risk of electrostatic influence received by the FinFET structure can be effectively reduced.

S2: providing holes in an edge region of the wafer 200 and depositing a conductive metal so as to form metal posts 300.

Figure 5:
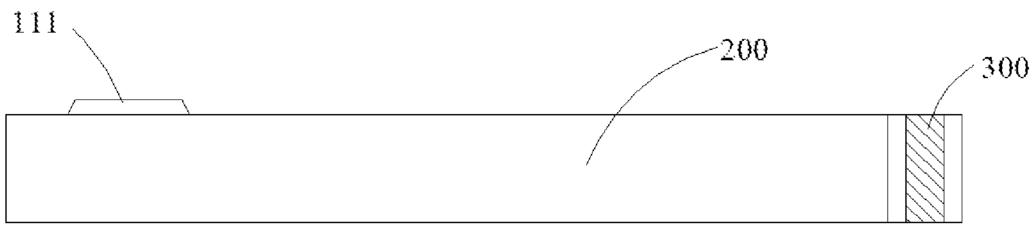

Specifically, referring to FIG. 5, the wafer 200 is placed on a platform, and holes are provided in the edge region of the wafer 200 by laser or etching, then, by means of electroplating, a conductive metal, such as copper or silver, is deposited in the holes to form the metal posts 300, wherein the metal posts 300 penetrate through the front surface and the back surface of the wafer 200, the metal posts 300 can effectively solve the problem of electrostatic discharge in the processing process of the wafer 200, thus, the front surface and the back surface of the wafer 200 form an equipotential structure.

It is worth noting that, in the present embodiment, the metal posts 300 are designed in the edge region of the wafer 200, and the metal posts 300 can effectively address the electrostatic discharge in the processing process of the wafer 200, so that the surface of the wafer 200 and the back surface of the wafer 200 realize equipotential (the processing process of the wafer 200, for example, includes grinding/sputter-deposition/sputter-etching/exposure and development). In the sputtering process, electrostatic ions tend to exist on the surface of the wafer 200, and then the configuration of the metal posts 300 avoids the problem that the wafer 200 is broken down up and down by the electronic ions in the bombardment process to cause appearance of hidden crack points on the back surface of the wafer 200, and avoids abnormal electric discharge phenomena such as arcing on the surface, thus ensuring normal operation of the wafer 200, further ensuring the yield of the wafer 200. In addition, the metal posts 300 can improve electrical conductivity of an electroplating solution when electroplating the wafer 200 with the metal layer 211, so that not only front-surface electroplating of the wafer 200 can be achieved, but also back-surface electroplating of the wafer 200 can be achieved, thus greatly improving the efficiency of metal electroplating. Moreover, edge strength of the wafer 200 is improved through the metal posts 300, because the conventional wafer 200 has a substrate of silicon, silicon nitride, and gallium nitride, the edge of the wafer 200 is easily damaged. Furthermore, a gripper can be prevented from touching or damaging the wafer 200 during transportation. The metal posts 300 on the wafer 200 can also address the heat concentration phenomenon brought about by baking after gluing in the manufacturing process of the wafer 200, so as to improve the heat dissipation performance of the wafer 200, and reduce the warpage problem caused by mismatch of coefficients of thermal expansion of various materials used in the manufacturing process of the wafer 200 for preparation, and improve the uniformity of wiring and electroplating of the wafer 200.

It should be noted that, in the present embodiment, the wafer 200 may also be marked at the edge, for example, in a crystal-pulling process of a silicon rod, the silicon rod is cut into a segment of silicon substrate 210 (a round wafer 200 substrate), and the metal posts 300 are designed in the edge region of the silicon substrate 210, which may be of a ring-shaped array structure, and meanwhile, a notch may be designed in the edge region, wherein the notch features a P-type or N-type wafer 200 substrate.

S3: forming a protective layer 130 not covering the metal posts 300 on the front surface of the wafer 200.

Figure 6:
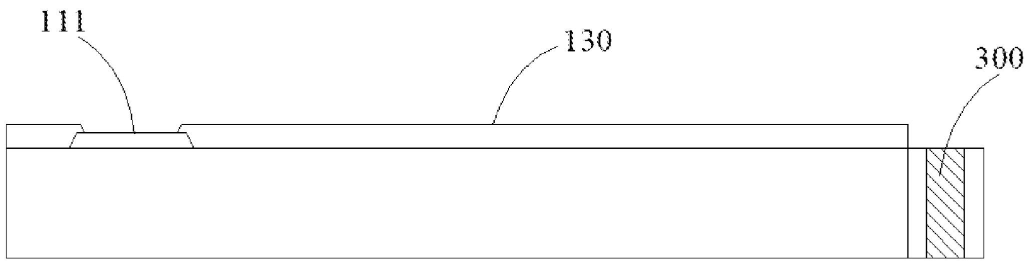

Specifically, referring to FIG. 6, after completing the preparation of the metal posts 300, a liquid passivation layer can be uniformly coated on the wafer 200 by coating equipment in a spin coating manner, to form the protective layer 130, and then the protective layer 130 is subjected to soft bake and shaped into a film by means of a hot plate. By means of an exposure machine, positions of the passivation layer where holes are to be provided are covered by a photomask in a proximity method and are not exposed to light, the unexposed regions are removed by spraying with a developer in a developing manner, to expose positions of holes of aluminum pad, then the passivation layer is heated again by an oven to cure the same more quickly to a completely aged stable state, and then organic pollutants on the surface of the passivation layer or residues in the holes are removed by descum, completing the process of exposing the aluminum pad. In the above, the passivation layer may be made of a polymer dielectric material, for example, an epoxy, polyimide, and phenylcyclobutene.

It should be noted that, in the present embodiment, the protective layer 130 needs to be coated only in the active area during coating, that is, avoiding the edge region of the wafer 200, thus avoiding covering the metal layer 211. Alternatively, the passivation layer in the edge region may also be removed when forming the holes of the pad.

S4: forming a first dielectric layer 150 not covering the metal posts 300 on the protective layer 130.

Figure 7:
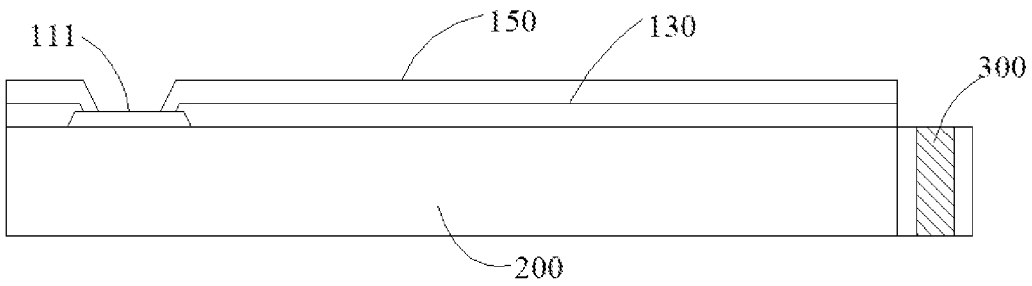

Specifically, referring to FIG. 7, after forming the protective layer 130, the manufacturing process (exposure/development/baking/descum) of forming the protective layer 130 is repeated again to form a dielectric layer (polymer layer), and form an aluminum pad opening on the dielectric layer.

In the above, a material of the dielectric layer is an amine cured epoxide material, epoxide polymer, polyimide, etc.

S5: forming a circuit layer 170 covering the metal posts 300 on the first dielectric layer 150 by electroplating.

Figure 8:
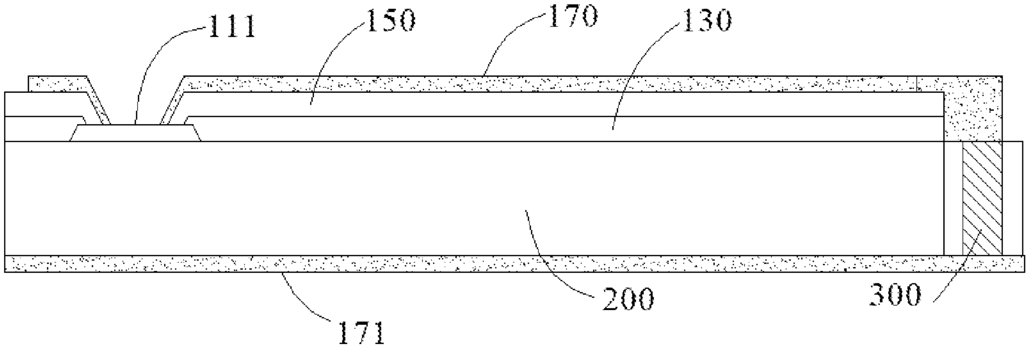

Specifically, referring to FIG. 8, first, a protective glue layer may be formed on the first dielectric layer 150, then a circuit pattern slot is formed on the protective glue layer, then the circuit layer 170 is formed in the circuit pattern slot with the metal post 300 as a start point of electroplating, and then the protective glue layer is removed, so as to form the circuit layer 170 for complete coverage. In the above, thickness of the circuit layer 170 may be 3-5 μm.

When actually preparing the circuit layer 170, firstly, a photoresist may be coated on the surface of the first dielectric layer 150, then an RDL circuit layer slot is provided through a photolithographic process (exposure/development/baking), and then a metal copper layer is sputtered in the slot through the sputtering process (first, a layer of Ti/Cu is sputtered, and then a copper layer is sputtered, wherein the first layer of Ti/Cu mainly functions to improve a binding force of the second layer of copper), to form RDL circuit, and organic pollutants on a surface of the RDL circuit or residues in the hole are removed by the descum again.

It should be noted that, before the step of forming the circuit layer 170 by electroplating in the circuit pattern slot with the metal post 300 as the start point of the electroplating, i.e., after making the exposure opening (the opening of the circuit pattern slot), the wafer 200 is preferentially placed on an electroplating platform upside down, thus the wafer 200 is electroplated from a back surface of the metal post 300, preventing the pattern layer from being polluted. Specifically, a metal layer 171 can be formed on the back surface of the wafer 200, and the electroplating of the circuit layer 170 is completed when the metal layer 171 is formed, and front surface pollution can be can effectively avoided. Alternatively, in other embodiments, the wafer 200 can be immersed in a solvent by a rack plating method, and the electroplating is achieved through reduction reaction. This approach improves the electroplating conductivity through the metal posts 300, thus improving the electroplating uniformity of the wafer 200.

S6: removing the circuit layer 170 covering the metal posts 300 by etching, to expose the metal posts 300.

Figure 9:
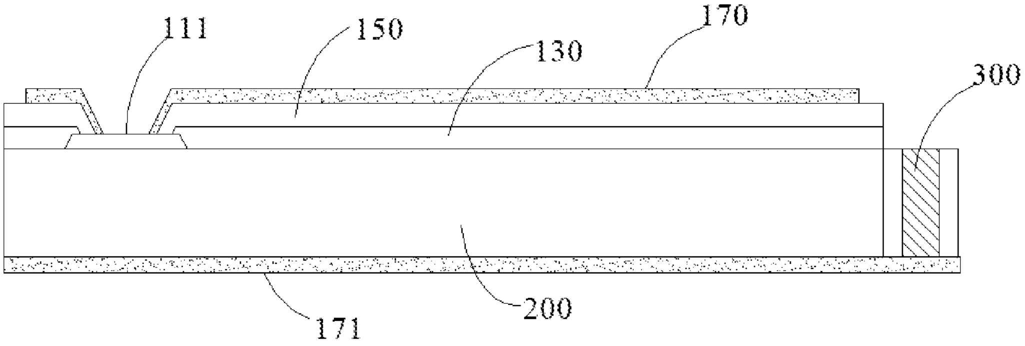

Specifically, referring to FIG. 9, after the circuit layer 170 is prepared, a copper layer of electroplated wire in a step portion is removed by etching in a chemical etching method in the step portion of the edge of the wafer 200, i.e., removing the circuit layer 170 in the edge region, and exposing the metal posts 300. In the above, the chemical etching method may be acid etching or alkaline etching.

It should be noted that, excessive circuit layer 170 may also be removed herein in a cutting manner to avoid etching. Specifically, the excessive circuit layer 170 and the metal posts 300 at the edge of the wafer 200 may be removed together, thereby omitting a subsequent step of separately cutting the metal posts 300.

S7: forming a second dielectric layer 180 on the circuit layer 170.

Figure 10:
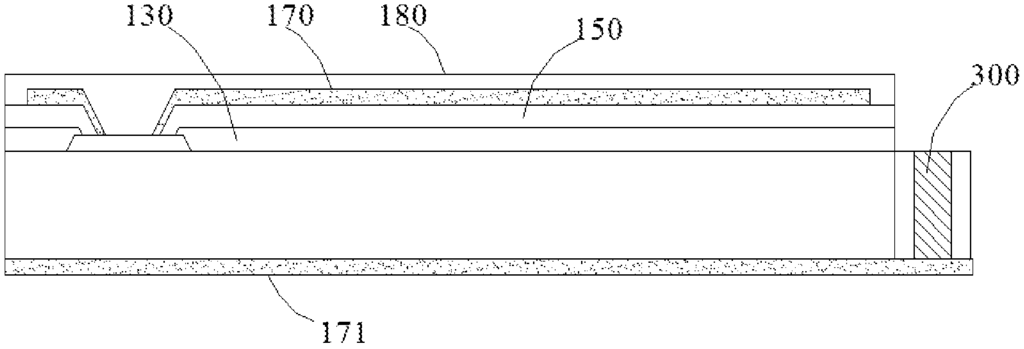

Specifically, referring to FIG. 10, after the circuit layer 170 is completed, a dielectric material is coated again on the surface of the circuit layer 170 to form the second dielectric layer 180. In the above, a material of the second dielectric layer 180 is consistent with that of the first dielectric layer 150.

S8: forming a conductive bump on the second dielectric layer 180.

Figure 11:
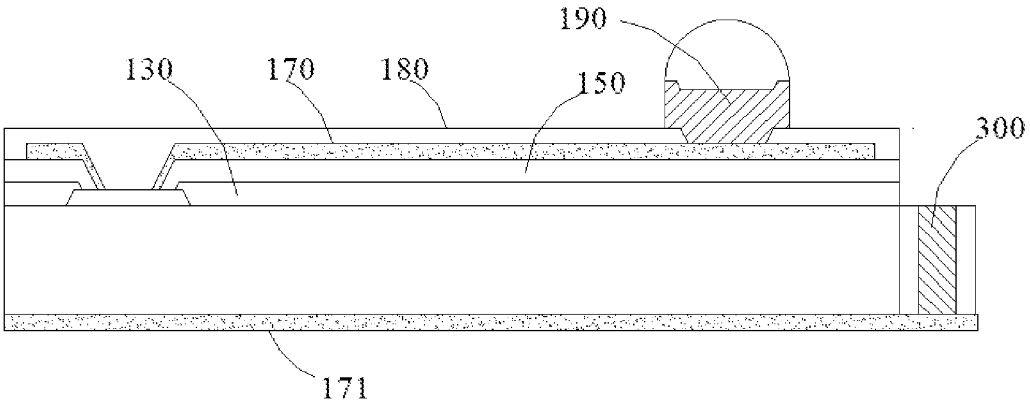

Specifically, referring to FIG. 11, after the second dielectric layer 180 is formed, a copper post/UBM metal layer opening is formed on the second dielectric layer 180 through an exposure/development/baking/descum manufacturing process, then the metal layer is sputtered in the opening, a metal copper layer is electroplated, to form the copper post, and then a solder ball is formed through a printing or coating process, thus forming the conductive bump. In the above, a basic preparation principle of the conductive bump is consistent with that of a conventional solder bump. A material of the metal layer may be made of titanium (Ti), titanium nitride (TiN), tantalum nitride (TaN), tantalum (Ta), or the like, and the opening of the copper post is of a groove structure.

S9: cutting along the edge of the wafer 200 to cut off the metal posts 300.

Figure 12:
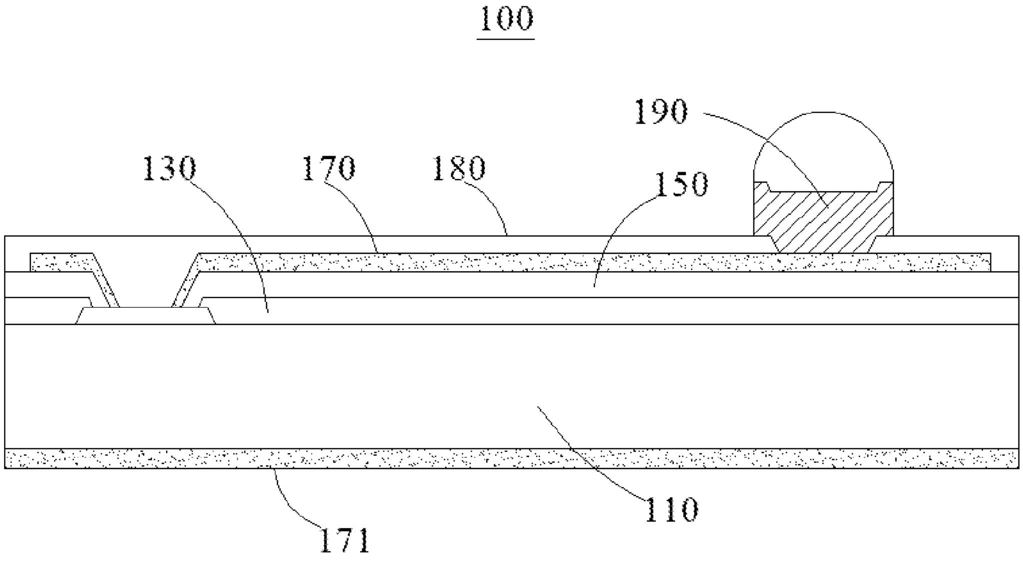

Specifically, referring to FIG. 12, first, the edge region can be removed, so as to obtain the structure of the wafer 200 without the metal posts 300, and then a single product is formed according to a conventional cutting process.

Figure 13:
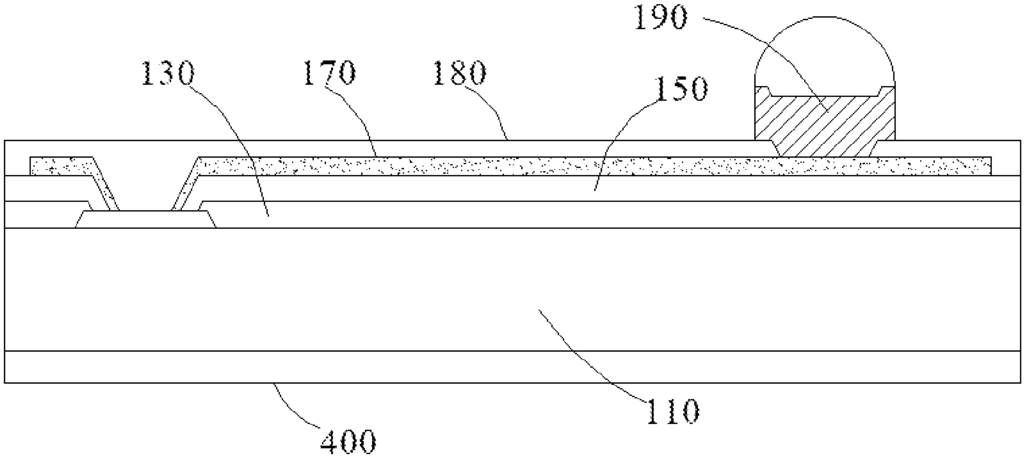

It should be noted that, with reference to FIG. 13, in other embodiments of the present disclosure, after the conductive bump is formed, a back glue film layer 400 may also be formed on the back surface of the wafer 200, so as to be capable of protecting the FinFET structure and covering the metal layer structure. Definitely, the back glue film layer 400 herein can replace the metal layer 171, and can also form a laminated structure with the metal layer 171, so that the heat dissipation effect can be greatly improved. The wafer 200 is placed on a sputtering platform upside down. In the sputtering process, a metal heat dissipation layer is sputtered, and the metal posts thereof serve as electroplating wires to introduce the electroplating solution, so as to form an RDL circuit layer.

Certainly, in other embodiments of the present disclosure, the metal posts 300 may not be removed, so that some products have the structure of metal posts 300.

With continued reference to FIG. 13, the present embodiment further provides a fan-in package structure 100, which is prepared by the preceding preparation method, wherein the fan-in package structure 100 includes a device base 110 with a pad 111 on a front surface thereof, a protective layer 130 provided on the front surface of the device base 110, a first dielectric layer 150 provided on the protective layer 130, a circuit layer 170 provided on the first dielectric layer 150, a second dielectric layer 180 provided on the circuit layer 170, and a conductive protrusion 190 provided on the second dielectric layer 180, wherein the first dielectric layer 150 is provided with a protective opening penetrating to the pad 111, the circuit layer 170 is in electrical contact with the pad 111, the conductive protrusion 190 is in electrical contact with the circuit layer 170, and the device base 110 is formed by cutting the wafer 200. It should be noted that, in the preparation process, the metal posts need to be provided at the edge of the wafer 200, and the edge region needs to be cut off at the later stage of the manufacturing process, so as to form the fan-in package structure 100 without the metal posts.

The present embodiment provides a preparation method of a fan-in package structure 100 and the fan-in package structure 100. First, a chip manufacturing process is completed in an active area of a wafer 200 to form the wafer 200 with a pad 111 on a front surface, then, holes are provided in an edge region of the wafer 200, and conductive metal is deposited to form metal posts 300, and then after a protective layer 130 and a first dielectric layer 150 are sequentially prepared, a circuit layer 170 is formed by electroplating, then the circuit layer 170 covering the metal posts 300 is removed by etching, and then a second dielectric layer 180 and a conductive bump are formed, completing the fan-in package structure, wherein the metal posts 300 penetrate through the front surface and a back surface of the wafer 200, so that the front surface and the back surface of the wafer 200 realize equipotential. By designing the metal posts 300 in the edge region of the wafer 200, electrostatic discharge in the processing process of the wafer 200 can be effectively solved, thus, two side surfaces of the wafer 200 realize equipotential, so as to avoid the problem that upper and lower sides of the wafer 200 are broken down by electric ions due to electrostatic ion bombardment in a sputtering process, meanwhile avoid appearance of hidden crack points on the back surface of the wafer 200 and the abnormal electric discharge phenomenon on the surface of the wafer 200, and ensure normal operation of the wafer 200. In addition, the metal posts 300 can improve electrical conductivity of an electroplating solution when electroplating the wafer 200 with the metal layer 211, which not only can realize front-surface electroplating of the wafer 200, but also can realize back-surface electroplating of the wafer 200, thus greatly improving the efficiency of metal electroplating. Moreover, edge strength of the wafer 200 is improved through the metal posts 300, preventing a gripper from touching or damaging the wafer during transportation. The metal posts 300 on the wafer 200 can also address the heat concentration phenomenon brought about by baking after gluing in the manufacturing process of the wafer 200, improve the heat dissipation performance of the wafer 200, reduce the warpage problem caused by mismatch of coefficients of thermal expansion of various materials used in the manufacturing process of the wafer 200 for preparation, and improve the uniformity of wiring and electroplating of the wafer 200.

An embodiment of the present disclosure provides a preparation method of a fan-in package structure 100, of which basic steps and principle as well as the technical effect produced are the same as those in the first embodiment, and for the sake of concise description, reference may be made to corresponding contents in the first embodiment for contents which are not mentioned in the part of the present embodiment.

The present embodiment is different from the first embodiment in step S5.

When performing step S5, first, a protective glue layer 500 can be formed on the first dielectric layer 150, then a circuit pattern slot is formed on the protective glue layer 500, then an adhesive layer 600 is coated on the back surface of the wafer 200, then the back surfaces of two wafers 200 are stuck together through the adhesive layer 600, then the circuit layer 170 is formed in the circuit pattern slot with the metal post 300 as a start point of electroplating, after that excessive circuit layer 170 is removed by etching, and finally, the protective glue layers 500 are peeled off and removed. In the above, the metal posts 300 on the two wafers 200 are corresponding to each other.

Further, in the present embodiment, before the step of bonding the back surfaces of the two wafers 200 together through the adhesive layer 600, a groove further can be formed on the adhesive layer 600, and the metal posts 300 are exposed, and then a copper layer or a conductive glue layer is filled in the groove, wherein the copper layer or the conductive glue layer is configured to be in contact with adjacent metal post 300, so that the two stuck metal posts 300 are in electrical contact through the conductive glue layer.

Figure 14:
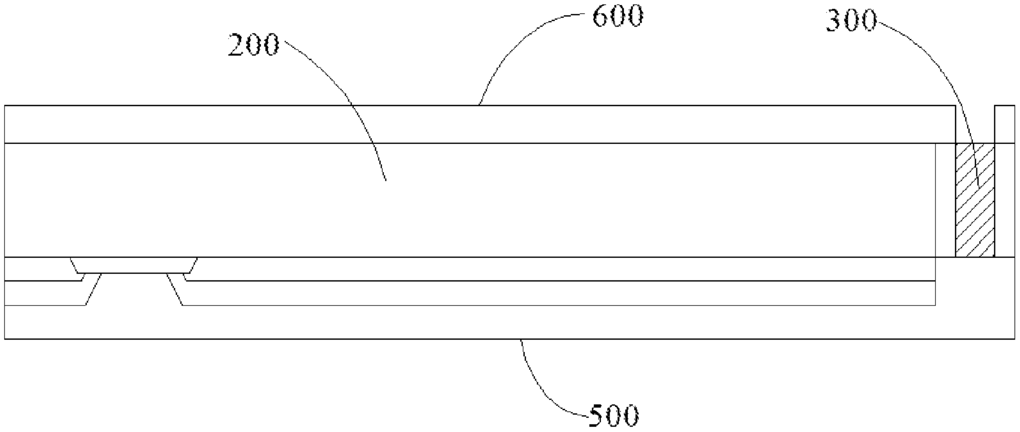
FIG. 14 to FIG. 18 are process flowcharts of the preparation method of a fan-in package structure provided in an embodiment of the present disclosure.

Specifically, referring to FIG. 14, first, a photoresist can be applied to a surface of the first dielectric layer 150 to form the protective glue layer 500, and then after the circuit pattern slot is formed after grooving, the adhesive layer 600 is applied to the back surface of the wafer 200, and then the groove is provided on the adhesive layer 600 to expose the metal posts 300.

Figure 15:
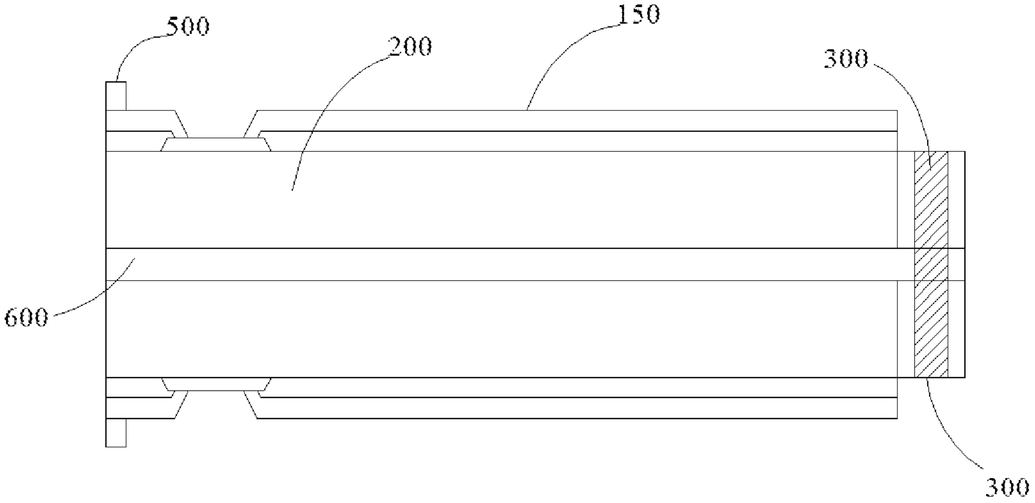

With reference to FIG. 15, after the groove of the adhesive layer 600 is filled with the copper layer or the conductive glue layer, the back surfaces of the two wafers 200 are bonded together through the adhesive layer 600, and the two metal posts 300 are corresponding to each other and are in electrical connect through the copper layer or the conductive glue layer, so that the front surfaces of the two wafers 200 remain equipotential.

Figure 16:
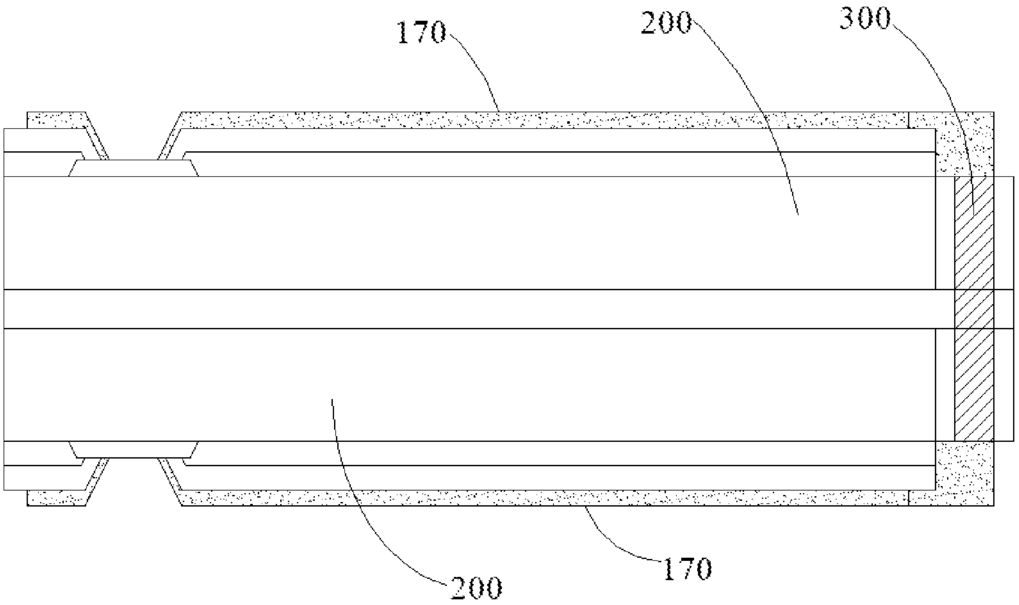
Figure 17:
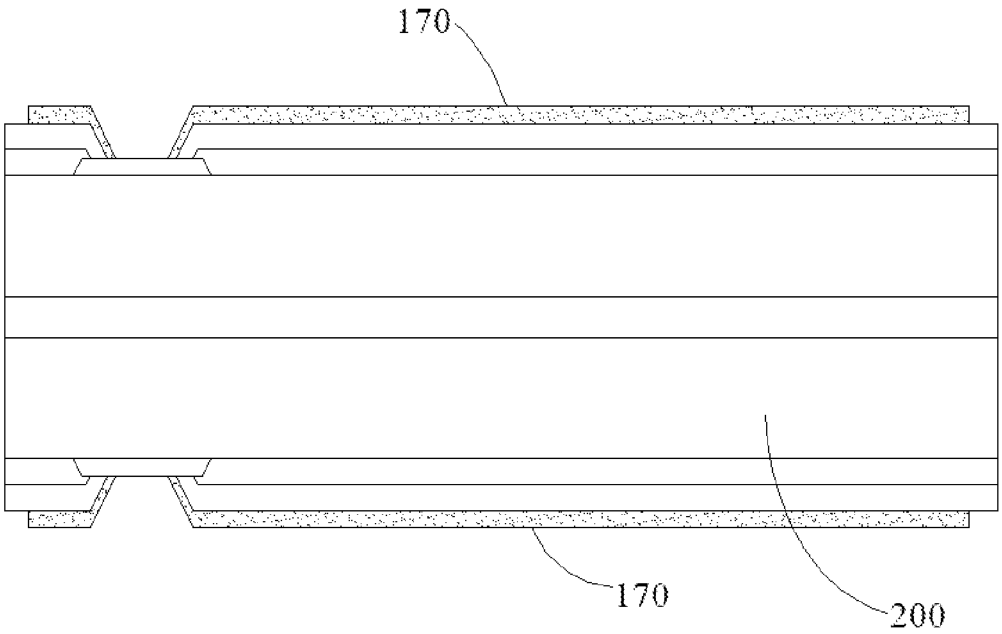

With reference to FIG. 16 and FIG. 17, after the bonding is completed, the electroplating process continues to be completed so as to form the circuit layer 170, then step S6 continues to be performed, and after the circuit layer 170 in the edge region is removed by etching, the edge region of the wafer 200 is removed.

It should be noted that, herein, the circuit layer 170 in the edge region also can be removed by cutting, so as to avoid etching. Specifically, the circuit layer 170 in the edge region and the metal posts 300 can be removed together, thereby omitting a separate cutting step caused by separate manufacturing processes, further simplifying the process flow.

Figure 18:
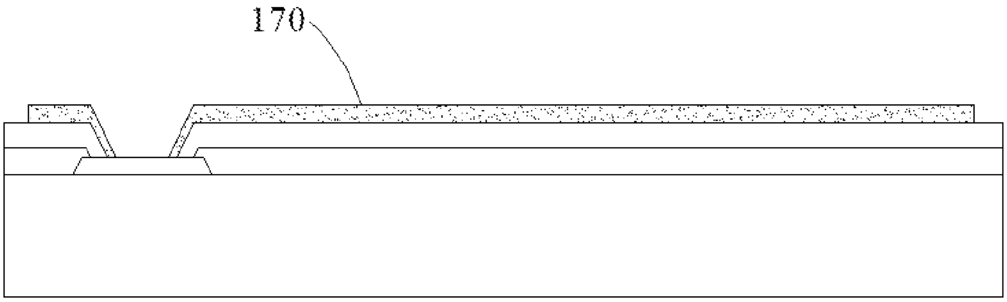

Referring to FIG. 18, after the edge region of the wafer 200 is removed, the two wafers 200 are separated by debonding and cleaning the glue layers, and then subsequent steps S7 to S8 continue to be completed.

According to the preparation method of a fan-in package structure 100 provided in the present embodiment, two wafers 200 can be simultaneously electroplated by means of back-to-back adhesion, thus greatly improving electroplating efficiency, and meanwhile also ensuring electroplating accuracy.

An embodiment of the present disclosure provides a preparation method of a fan-in package structure 100, of which basic steps and principle as well as the technical effect produced are the same as those in the first embodiment, and for the sake of concise description, reference may be made to corresponding contents in the first embodiment for contents which are not mentioned in the part of the present embodiment.

The present embodiment is different from the first embodiment in step S5.

When performing step S5, first, the protective glue layer 500 can be formed on the first dielectric layer 150, then the circuit pattern slot is formed on the protective glue layer 500, then the protective glue layers 500 on the two wafers 200 are correspondingly stuck together, then the circuit layer 170 is formed in the circuit pattern slot with the metal post 300 as a start point of electroplating, then excessive circuit layer 170 is removed by etching, and finally, the protective glue layers 500 are peeled off and removed. In the above, the metal posts 300 are arranged in a staggered manner.

In the present embodiment, after the circuit pattern slot is formed, the protective glue layer 500 in the edge region needs to be retained, and the protective glue layer 500 needs to be locally kept in a protruding state, and then the protective glue layers 500 on the two wafers 200 are aligned and attached, so that the circuit pattern slots on the two wafers 200 are aligned and communicated, to form a relatively large electroplating space, facilitating rack plating.

Figure 19:
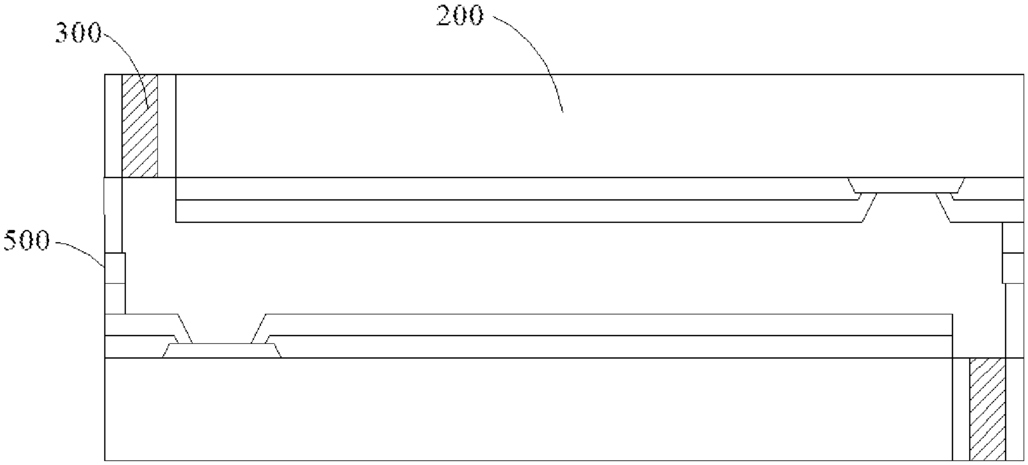
FIG. 19 to FIG. 20 are process flowcharts of the preparation method of a fan-in package structure provided in an embodiment of the present disclosure.

Specifically, referring to FIG. 19, after forming the circuit pattern slots, the front surfaces of the two wafers 200 are attached together, and the metal posts 300 on the two wafers 200 can be arranged in a staggered manner, to avoid sticking to each other during electroplating. Definitely, the metal posts 300 on the two wafers 200 herein may also be disposed in alignment, or positions of the metal posts 300 on the wafers 200 are not limited.

Figure 20:
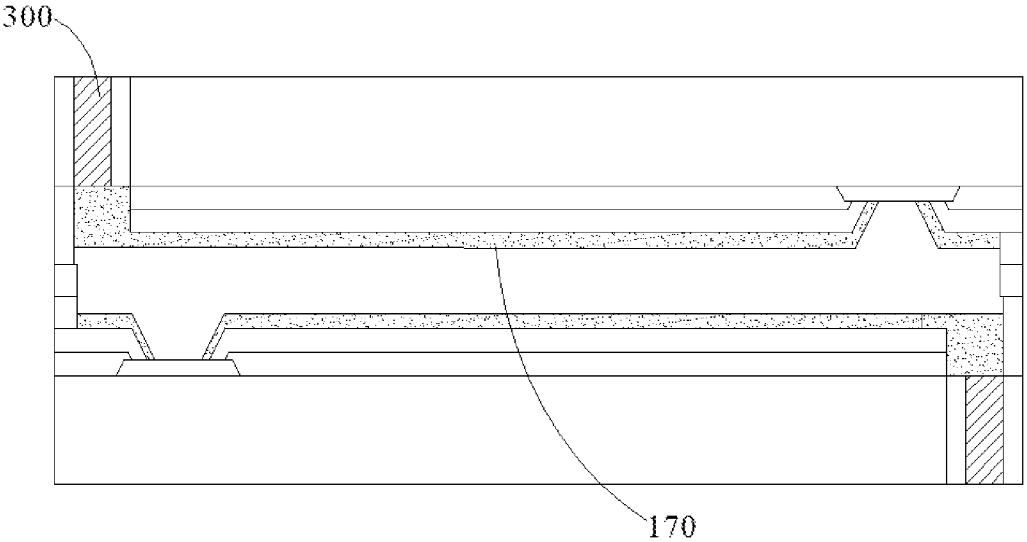

With reference to FIG. 20, after the two wafers 200 are attached, an electroplating operation can be performed, and specifically, the rack plating method can be used to form the circuit layer 170 in the circuit pattern slot. In the above, thickness of the circuit layer 170 may be 3-5 μm. Moreover, thickness of the protective glue layer 500 needs to be much greater than that of the circuit layer 170, so that it avoids two circuits layer 170 from being connected while facilitating the electroplating.

It should be noted that, in the present embodiment, the front surfaces of the two wafers 200 are attached so as to form an inner cavity structure, which avoids entry of contaminants such as external dust to pollute the patterned structure while facilitating the electroplating, and in this case, the wafers 200 themselves can have a certain shielding function, so that this structure can play a dustproof role.

Referring to FIG. 8, after the circuit layer 170 is formed, a single wafer 200 with the circuit layer 170 can be formed by debonding, and the protective glue layer 500 is removed. Then, step S6 to step S9 continue to be performed.

According to the preparation method of a fan-in package structure 100 provided in the present embodiment, two wafers 200 can be simultaneously electroplated by means of back-to-back adhesion, thus greatly improving the electroplating efficiency, and meanwhile also ensuring the electroplating accuracy.

An embodiment of the present disclosure provides a fan-in package structure 100, prepared by the preparation method of a fan-in package structure according to any one of the preceding embodiments, wherein the fan-in package structure 100 includes:

- a device base 110 with a pad 111 on a front surface thereof;
- a protective layer 130 provided on the front surface of the device base 110;
- a first dielectric layer 150 provided on the protective layer 130, wherein the first dielectric layer 150 is provided with a protective opening penetrating to the pad 111;
- a circuit layer 170 provided on the first dielectric layer 150, wherein the circuit layer 170 is in electrical contact with the pad 111;
- a second dielectric layer 180 provided on the circuit layer 170; and
- a conductive protrusion 190 provided on the second dielectric layer 180, wherein the conductive protrusion 190 is in electrical contact with the circuit layer 170.

The present disclosure includes, for example, the following beneficial effects.

The embodiments of the present disclosure provide a preparation method of a fan-in package structure, wherein first, the chip manufacturing process is completed in the active area of the wafer to form the wafer with the pad on the front surface, then, holes are provided in the edge region of the wafer, and the conductive metal is deposited to form the metal posts, and then after the protective layer and the first dielectric layer are sequentially prepared, the circuit layer is formed by electroplating, then the circuit layer covering the metal posts is removed by etching, and then the second dielectric layer and the conductive bump are formed, completing the fan-in package structure, wherein the metal posts penetrate through the front surface and the back surface of the wafer, so that the front surface and the back surface of the wafer realize equipotential. By designing the metal posts in the edge region of the wafer, electrostatic discharge in the processing process of the wafer can be effectively solved, thus, two side surfaces of the wafer realize equipotential, the problem that upper and lower sides of the wafer are broken down by electric ions due to electrostatic ion bombardment in the sputtering process is avoided, meanwhile it avoids appearance of hidden crack points on the back surface of the wafer and the abnormal electric discharge phenomenon on the surface of the wafer, and ensure normal operation of the wafer, in addition, the metal posts can improve electrical conductivity of an electroplating solution when electroplating the wafer with the metal layer, which not only can realize front-surface electroplating of the wafer, but also can realize back-surface electroplating of the wafer, thus greatly improving the efficiency of metal electroplating. Moreover, edge strength of the wafer is improved through the metal posts, preventing the gripper from touching or damaging the wafer during transportation. The metal posts on the wafer can also address the heat concentration problem brought about by baking after gluing in the manufacturing process of the wafer, improve the heat dissipation performance of the wafer, reduce the warpage problem caused by mismatch of coefficients of thermal expansion of various materials used in the manufacturing process of the wafer for preparation, and improve the uniformity of wiring and electroplating of the wafer. Compared with the prior art, the preparation method of a fan-in package structure provided in the present disclosure can effectively solve the problem of electrostatic discharge in the wafer processing process, so as to avoid the problem that upper and lower sides of the wafer are broken down by electric ions due to electrostatic ion bombardment in a sputtering process, meanwhile avoid appearance of hidden crack points on the back surface of the wafer and the abnormal electric discharge phenomenon on the surface of the wafer, ensure normal operation of the wafer, improve edge strength of the wafer, improve heat dissipation performance of the wafer, ensure electroplating uniformity, and improve electroplating efficiency.

The above-mentioned are merely for specific embodiments of the present disclosure, but the scope of protection of the present disclosure is not limited thereto, and changes or substitutions that may be easily conceived by any skilled person familiar with the technical field within the technical scope disclosed in the present disclosure should fall within the scope of protection of the present disclosure. Therefore, the scope of protection of the present disclosure should be based on the scope of protection of the claims.

INDUSTRIAL APPLICABILITY

For the preparation method of a fan-in package structure and the fan-in package structure, edge strength of the wafer is improved through the metal posts, and the gripper is prevented from touching or damaging the wafer during transportation. The metal posts can also address the heat concentration problem brought about by baking after gluing in the manufacturing process of the wafer, improve the heat dissipation performance of the wafer, reduce the warpage problem caused by mismatch of coefficients of thermal expansion of various materials used in the manufacturing process of the wafer for preparation, and improve the uniformity of wiring and electroplating of the wafer. Meanwhile, by the back-to-back adhesion, the fan-in package structure can realize simultaneous electroplating of two wafers, thus greatly improving the electroplating efficiency, and meanwhile also ensuring the electroplating accuracy.

What is claimed is:

1. A preparation method of a fan-in package structure, comprising steps of:

completing a chip manufacturing process in an active area of a wafer, so as to form the wafer with a pad on a front surface;

providing holes in an edge region of the wafer and depositing a conductive metal so as to form metal posts;

forming a protective layer not covering the metal posts on the front surface of the wafer;

forming a first dielectric layer not covering the metal posts on the protective layer;

forming a circuit layer covering the metal posts on the first dielectric layer by electroplating;

removing the circuit layer covering the metal posts by etching, to expose the metal posts;

forming a second dielectric layer on the circuit layer; and forming a conductive bump on the second dielectric layer, wherein the metal posts penetrate through the front surface and a back surface of the wafer, so that the front surface and the back surface of the wafer realize equipotential.

2. The preparation method of a fan-in package structure according to claim 1, wherein the step of forming a circuit layer covering the metal posts on the first dielectric layer by electroplating comprises:

forming a protective glue layer on the first dielectric layer;

forming a circuit pattern slot on the protective glue layer;

forming the circuit layer in the circuit pattern slot with the metal posts as a start point of the electroplating, and removing the protective glue layer.

3. The preparation method of a fan-in package structure according to claim 2, wherein before the step of forming the circuit layer in the circuit pattern slot by electroplating with the metal posts as a start point of the electroplating, the preparation method further comprises:

placing the wafer on an electroplating platform upside down.

4. The preparation method of a fan-in package structure according to claim 2, wherein before the step of forming the circuit layer in the circuit pattern slot by electroplating with the metal posts as a start point of the electroplating, the preparation method further comprises:

immersing the wafer in an electroplating solvent.

5. The preparation method of a fan-in package structure according to claim 2, wherein before the step of forming the circuit layer in the circuit pattern slot with the metal posts as a start point of the electroplating, the preparation method further comprises:

coating an adhesive layer on the back surface of the wafer; and sticking back surfaces of two wafers together through the adhesive layer, wherein two metal posts are corresponding to each other.

6. The preparation method of a fan-in package structure according to claim 5, wherein before the step of sticking back surfaces of two wafers together through the adhesive layer, the preparation method further comprises:

providing a groove on the adhesive layer, and exposing the metal posts; and filling a conductive glue layer in the groove, wherein the conductive glue layer is configured to be in contact with an adjacent metal post.

7. The preparation method of a fan-in package structure according to claim 6, wherein before the step of forming the circuit layer in the circuit pattern slot with the metal posts as a start point of the electroplating, the preparation method further comprises:

providing a groove on the adhesive layer, and exposing the metal posts; and filling a copper layer in the groove, wherein the copper layer is configured to be in contact with an adjacent metal post.

8. The preparation method of a fan-in package structure according to claim 2, wherein before the step of forming the circuit layer in the circuit pattern slot with the metal posts as a start point of the electroplating, the preparation method further comprises:

sticking protective glue layers on two wafers correspondingly together, wherein two metal posts are arranged in a staggered manner.

9. The preparation method of a fan-in package structure according to claim 2, wherein before the step of forming the circuit layer in the circuit pattern slot with the metal posts as a start point of the electroplating, the preparation method further comprises:

sticking protective glue layers on two wafers correspondingly together, wherein two metal posts are arranged in alignment.

10. The preparation method of a fan-in package structure according to claim 2, wherein a thickness of the protective glue layer is greater than that of the circuit layer.

11. The preparation method of a fan-in package structure according to claim 1, wherein after the step of forming a conductive bump on the second dielectric layer, the preparation method further comprises:

cutting along an edge of the wafer to cut off the metal posts.

12. The preparation method of a fan-in package structure according to claim 1, wherein the step of completing a chip manufacturing process in an active area of a wafer comprises:

providing a silicon substrate;

forming a hole on a back surface of the silicon substrate by etching;

electroplating in the hole to form a metal layer;

forming at least two discrete fins on a front surface of the silicon substrate;

forming a gate structure across the fins;

forming a source and a drain on two sides of the gate structure, so as to form a fin field-effect transistor; and forming a pad on the gate structure, wherein the metal layer is provided correspondingly to the fins.

13. The preparation method of a fan-in package structure according to claim 12, wherein after forming a back glue film layer on the back surface of the wafer, the preparation method further comprises:

replacing the metal layer with the back glue film layer.

14. The preparation method of a fan-in package structure according to claim 12, wherein after forming a back glue film layer on the back surface of the wafer, the preparation method further comprises:

forming a laminated structure by the metal layer and the back glue film layer.

15. The preparation method of a fan-in package structure according to claim 12, wherein materials of the metal layer comprise titanium, titanium nitride, tantalum nitride, and tantalum.

16. The preparation method of a fan-in package structure according to claim 1, wherein after the step of forming a conductive bump on the second dielectric layer, the preparation method further comprises:

forming a back glue film layer on the back surface of the wafer.

17. The preparation method of a fan-in package structure according to claim 1, wherein the metal posts are formed at an edge of the wafer.

18. The preparation method of a fan-in package structure according to claim 1, wherein after forming the second dielectric layer, an opening of a copper post is formed on the second dielectric layer.

19. The preparation method of a fan-in package structure according to claim 18, wherein the opening of the copper post comprises a groove structure.

* * * * *